United States Patent
Genenncher et al.

(10) Patent No.: US 9,367,882 B2
(45) Date of Patent: Jun. 14, 2016

(54) WAFERSTART PROCESSES AND SYSTEMS FOR INTEGRATED CIRCUIT FABRICATION

(75) Inventors: Tony Genenncher, Dresden (DE); Stephan Puelm, Dresden (DE); Michael Foerster, Görlitz (DE); Juergen Sieberg, Dresden (DE)

(73) Assignee: GLOBALFOUNDRIES, INC., Grand Cayman (KY)

( * ) Notice: Subject to any disclaimer, the term of this patent is extended or adjusted under 35 U.S.C. 154(b) by 289 days.

(21) Appl. No.: 13/568,449

(22) Filed: Aug. 7, 2012

(65) Prior Publication Data

US 2014/0046474 A1 Feb. 13, 2014

(51) Int. Cl.
*G06F 19/00* (2011.01)
*B65H 1/00* (2006.01)
(Continued)

(52) U.S. Cl.
CPC ............... *G06Q 50/04* (2013.01); *G06Q 10/08* (2013.01); *G06Q 50/28* (2013.01); *H01L 21/67294* (2013.01); *H01L 21/67769* (2013.01); *Y02P 90/30* (2015.11)

(58) Field of Classification Search
CPC ....... G06F 19/00; H01L 21/67; H01L 21/302; H01L 21/461; H01L 22/12; H01L 22/20; H01L 22/26; B65B 21/00; B65B 21/02; B65G 65/04; B65G 65/34; B24B 37/013; B01D 53/22; G01N 1/22; G01N 15/06
USPC ........... 700/121, 96, 112; 414/222, 225, 416, 414/806, 935, 273; 438/7, 8, 706; 454/187; 134/4, 18, 25, 26; 257/E21; 156/345
See application file for complete search history.

(56) References Cited

U.S. PATENT DOCUMENTS 7,134,826 B2 11/2006 Mitsuyoshi
7,992,734 B2 * 8/2011 Campbell et al. ............. 212/331
(Continued)

FOREIGN PATENT DOCUMENTS

CN 101150043 A 3/2008
CN 102131718 A 7/2011
(Continued)

OTHER PUBLICATIONS

The German Patent and Trade Mark Office, Translation of Official Communication for Germany Patent Application No. 10 2013 202 328.6, mailed Oct. 23, 2013.
(Continued)

*Primary Examiner* — Mohammad Ali
*Assistant Examiner* — Md Azad
(74) *Attorney, Agent, or Firm* — Ingrassia Fisher & Lorenz, P.C.

(57) ABSTRACT

A waferstart process for integrated circuit fabrication includes entering order information from requested wafers into a computer through a data input interface of the computer. A container is provided including supplied wafers and having a machine-readable medium associated therewith. The machine-readable medium is encoded with wafer data pertaining to the supplied wafers. The wafer data is entered from the machine-readable medium associated with the container into the computer. The order information and the wafer data are compared within the computer to create a verified data set in the computer upon the computer determining that the supplied wafers in the container correspond to the requested wafers in the order information. The verified data set is stored in a storage medium within the computer. The supplied wafers are transferred from the container to a front opening unified pod after creating the verified data set.

19 Claims, 2 Drawing Sheets

(51) Int. Cl.
  *B65G 1/00*    (2006.01)
  *G08B 13/14*   (2006.01)
  *B08B 3/00*    (2006.01)
  *B08B 7/00*    (2006.01)
  *G06Q 50/04*   (2012.01)
  *G06Q 50/28*   (2012.01)
  *G06Q 10/08*   (2012.01)
  *H01L 21/67*   (2006.01)
  *H01L 21/677*  (2006.01)

(56) References Cited

U.S. PATENT DOCUMENTS

| | | | |
|---|---|---|---|
| 8,251,635 B2 | 8/2012 | Yamamoto | |
| 2003/0187537 A1* | 10/2003 | Hocke et al. | 700/121 |
| 2004/0029299 A1 | 2/2004 | Pasadyn et al. | |
| 2004/0154417 A1 | 8/2004 | Renken et al. | |
| 2008/0030341 A1* | 2/2008 | Zhuang | 340/572.7 |
| 2008/0170932 A1* | 7/2008 | Yamamoto | 414/273 |
| 2008/0317565 A1 | 12/2008 | Menser, Jr. et al. | |
| 2009/0081007 A1 | 3/2009 | Tabrizi et al. | |
| 2011/0153065 A1 | 6/2011 | Tomioka et al. | |

FOREIGN PATENT DOCUMENTS

| | | |
|---|---|---|
| JP | 2007150369 A | 6/2007 |
| KR | 20010078287 A | 8/2001 |
| TW | 201010917 A1 | 3/2010 |

OTHER PUBLICATIONS

Taiwan Intellectual Property Office, Examination Report for Taiwanese Patent Application No. 101147771 mailed Oct. 29, 2014.
Korean Intellectual Property Office, Notice of Office Action for Korean Patent Application No. 10-2013-0023033 mailed Jun. 2, 2015.
The Intellectual Property Office, Decision Letter for Taiwanese Patent Application No. 101147771 mailed Jun. 29, 2015.
State Intellectual Property Office of The People'S Republic of China, Office Action for Chinese Patent Application No. 201310329162.5 dated Sep. 6, 2015.
The State Intellectual Property Office of P.R. China, Notification of Registration for Chinese Patent Application No. 201310329162.5 mailed Mar. 4, 2016.
The Korean Intellectual Property Office, Decision of Rejection in Korean Patent Application No. 10-2013-0023033 mailed Dec. 24, 2015.

* cited by examiner

WAFERSTART PROCESSES AND SYSTEMS FOR INTEGRATED CIRCUIT FABRICATION

TECHNICAL FIELD

The technical field generally relates to waferstart processes and systems for preparing supplied wafers for integrated circuit fabrication, and more particularly relates to waferstart processes and systems for verifying wafer information pertaining to supplied wafers with order information in anticipation of integrated circuit fabrication using the supplied wafers.

BACKGROUND

Tracking of supplied wafers is often necessary at integrated circuit fabrication facilities due to numerous considerations including, but not limited to, the need to accurately allocate supplied wafers when diverse fabrication lines are operated at the integrated circuit fabrication facilities that employ different supplied wafers; the need to verify that supplied wafers match requested wafers that have passed quality approval; and the need to handle and transfer supplied wafers from shipping containers, such as front opening shipping boxes (FOSBs), to front opening unified pods (FOUPs) that allow the supplied wafers to be accessed during automated integrated circuit fabrication.

Existing waferstart processes and systems are in place for registering receipt of requested wafers and for enabling quality approval of the requested wafers. For example, a Certificate of Assurance (CofA) is provided by a wafer supplier, such as a vendor or internal supplier at other locations within the integrated circuit fabrication facility. The CofA includes order information from requested wafers and various measurements of the requested wafers that are provided by the wafer supplier, and the information from the CofA is analyzed in a computer for quality approval. Once the order information is passed through quality approval, the shipment of requested wafers is registered in the computer and available for use in integrated circuit fabrication.

To commence integrated circuit fabrication, a production lotstart submits a query of available wafers to the computer, and FOSBs including supplied wafers that have passed quality approval are provided to the production lotstart for use in integrated circuit fabrication. The FOSBs that contain supplied wafers from the wafer supplier are then unwrapped, followed by placing the supplied wafers and an empty FOUP on a sorter. A batch of individual supplied wafers is then registered in the computer and placed into the empty FOUP in anticipation of fabricating integrated circuits using the supplied wafers. Wafer identifications for individual supplied wafers are manually read on the sorter and entered into the computer to create the batch. Significant user error is attendant in the process of creating the batches and transferring individual supplied wafers into the FOUP using the sorter. Further, the process of creating the batches and entering the wafer identifications for individual supplied wafers is time-consuming and is detrimental to process efficiency.

Accordingly, it is desirable to provide waferstart processes and systems that minimize time required to register supplied wafers in a computer while verifying that the supplied wafers are approved for quality and while minimizing opportunities for user error. Furthermore, other desirable features and characteristics of the present invention will become apparent from the subsequent detailed description of the invention and the appended claims, taken in conjunction with the accompanying drawings and this background of the invention.

BRIEF SUMMARY

Waferstart processes and waferstart systems for integrated circuit fabrication are provided herein. In an embodiment, a waferstart process for integrated circuit fabrication includes entering order information from requested wafers into a computer through a data input interface of the computer. A container is provided that includes supplied wafers and that has a machine-readable medium associated with the container. The machine-readable medium is encoded with wafer data pertaining to the supplied wafers in the container. The wafer data is entered from the machine-readable medium associated with the container into the computer. The order information from the requested wafers and the wafer data from the supplied wafers are compared within the computer to create a verified data set in the computer upon the computer determining that the supplied wafers in the container correspond to the requested wafers in the order information. The verified data set is stored in a storage medium within the computer. The supplied wafers are transferred from the container to a front opening unified pod after creating the verified data set.

In another embodiment, a waferstart process for integrated circuit fabrication includes entering order information from requested wafers into a computer through a data input interface of the computer. The order information includes a carrier identification. A container including supplied wafers and having a machine-readable medium associated therewith is provided. The machine-readable medium is encoded with wafer data pertaining to the supplied wafers in the container including a carrier identification for the container and a wafer identification for individual supplied wafers in the container. The container is loaded into a stocker, and the wafer data from the machine-readable medium associated with the container is read with a sensing device while the container is disposed in the stocker. The wafer data is transferred from the sensing device to the computer, and the carrier identification of the container and the carrier identification of the order information are matched within the computer to create a verified data set in the computer. The verified data set is created to include a location of the supplied wafers in the stocker. The verified data set is stored in a storage medium within the computer. The supplied wafers are transferred from the container to a front opening unified pod after creating the verified data set. The front opening unified pod including the supplied wafers are transferred back to the stocker after transferring the supplied wafers from the container to the front opening unified pod. The front opening unified pod is located within the stocker with the computer using the location of the supplied wafers in the stocker in response to a query of verified data sets received by the computer. The front opening unified pod is transferred from the stocker to a production lotstart for commencing integrated circuit fabrication using the supplied wafers in response to the query of verified data sets received by the computer after the computer locates the front opening unified pod within the stocker.

In another embodiment, a waferstart system for integrated circuit fabrication includes a computer including a data input interface and a storage medium. The computer is configured to receive order information from requested wafers through the data input interface of the computer. The computer is also configured to receive wafer data pertaining to supplied wafers. The waferstart system further includes a stocker that has a plurality of slots adapted to receive a container including supplied wafers, with the container having a machine-readable medium associated with the container. The machine-readable medium is encoded with the wafer data that pertains to the supplied wafers in the container. The waferstart system further includes a sensing device that is adapted to read the wafer data from the machine-readable medium associated with the container. The sensing device is in informational communication with the computer for transferring the wafer data from the sensing device to the computer. The waferstart system further includes a container transporter that is adapted to move the container into and out of the plurality of slots in the stocker. The computer is configured to compare the order information from the requested wafers and the wafer data from the supplied wafers within the computer to create a verified data set in the computer and the storage medium is adapted to store the verified data set in the storage medium. The computer is further adapted to initiate transfer of the supplied wafers from the container into and out of the stocker to a front opening unified pod using the container transporter based upon creation of and/or information contained in the verified data set.

BRIEF DESCRIPTION OF THE DRAWINGS

The present invention will hereinafter be described in conjunction with the following drawing figures, wherein like numerals denote like elements, and wherein.

DETAILED DESCRIPTION

Figure 1:
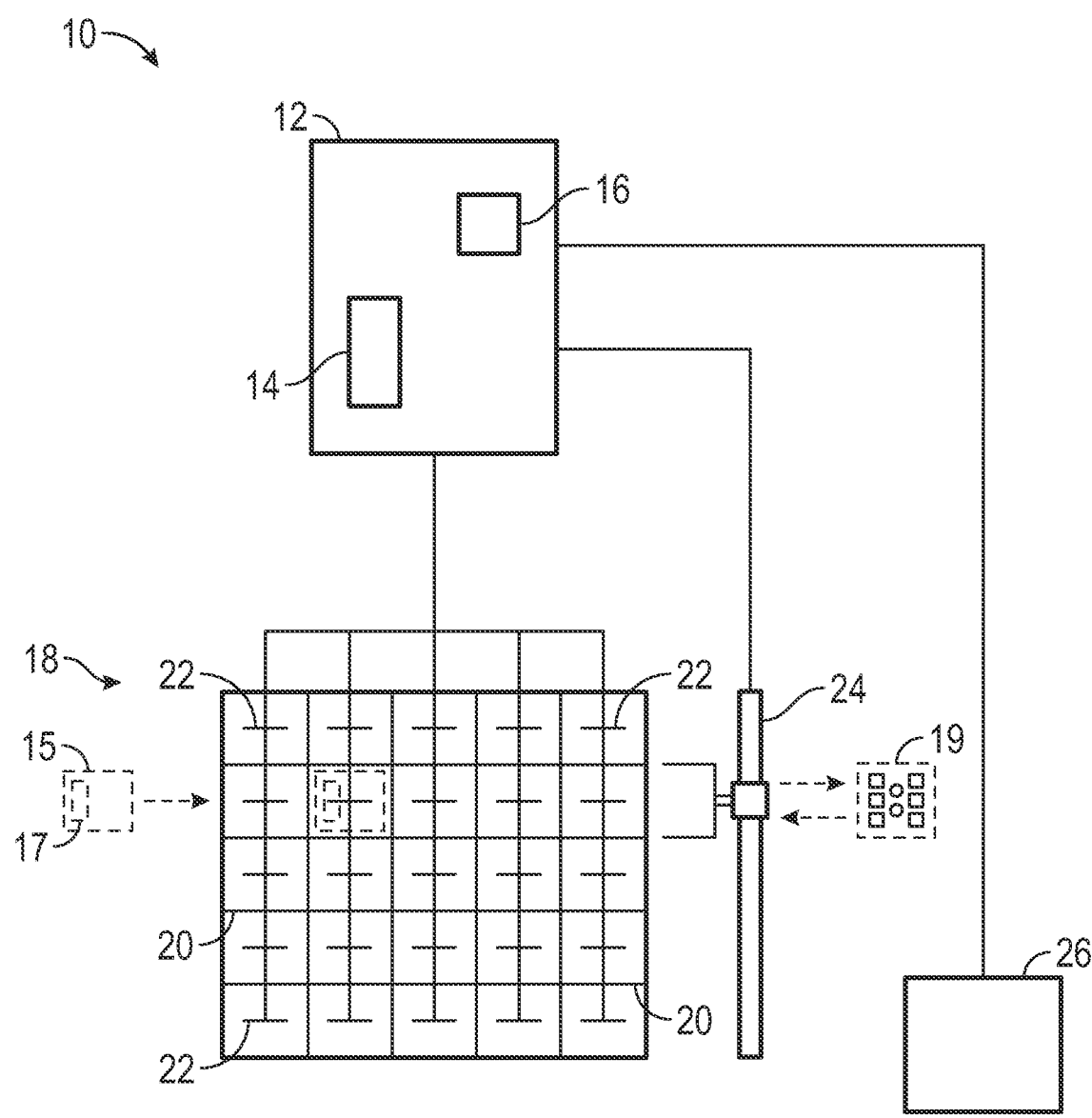
FIG. 1 is a schematic representation of a waferstart system in accordance with an embodiment.

The following detailed description is merely exemplary in nature and is not intended to limit the invention or the application and uses of the invention. Furthermore, there is no intention to be bound by any theory presented in the preceding background or the following detailed description.

Waferstart processes and systems are provided herein. The term "waferstart" as used herein, refers to procedures and equipment that are employed with regards to procurement, organization, allocation, and preparation of wafers, such as semiconductors, in anticipation of commencing integrated circuit fabrication using the wafers. Waferstart processes and systems are useful in integrated circuit fabrication facilities to ensure that the proper wafers are directed to specific integrated circuit fabrications because integrated circuit fabrication facilities may have different fabrication lines that use different wafers, and usage of the wrong wafers may result in line shutdowns and wasted products. The waferstart processes and systems provided herein minimize time requirements for registering supplied wafers in a computer while enabling the supplied wafers to be approved for quality and while minimizing opportunities for user error during data entry. In particular, order information from requested wafers is entered into a computer, with quality approval optionally conducted based upon the order information. As referred to herein, "order information" is information regarding requested wafers that a wafer supplier includes with a shipment of the wafers, and the order information may be included in a certificate of assurance (CofA), and the CofA may be provided in electronic form for direct entry into the computer. A container including supplied wafers and having a machine-readable medium associated therewith is also provided, with the machine-readable medium encoded with wafer data that pertains to the supplied wafers that are in the container. In this regard, the order information relates to the entire shipment, while the wafer data contained in the machine-readable medium pertains to supplied wafers in the particular container. The wafer data from the machine-readable medium that is associated with the container is entered into the computer, and the order information from the requested wafers and the wafer data from the supplied wafers is compared within the computer to create a verified data set that both correlates the supplied wafers in the container to the order information from requested wafers and contains a record of the supplied wafers in the container so that the record of supplied wafers need not be created during a separate sorting process, thereby obviating the need for a separate sorting process because location of the supplied wafers is already known. In particular, by creating the verified data set, the container including the supplied wafers is already registered in the computer before transferring the supplied wafers from the container to a front opening unified pod (FOUP) and registration of the supplied wafers after unpacking the container is not required, thereby obviating the need for a separate sorting step and decreasing time requirements and potential for user error during the separate sorting step.

An exemplary embodiment of a waferstart system and process will now be described with reference to FIGS. 1 and 2, respectively. Referring to FIG. 1, an exemplary waferstart system 10 for integrated circuit fabrication is shown. The exemplary waferstart system 10 includes a computer 12 including a data input interface 14 and a storage medium 16. The data input interface 14 can be a user interface, such as a keyboard and visual display, for manually entering data into the computer 12. Alternatively, the data input interface 14 can be an interface that enables electronic transfer of data into the computer 12 from an external source, e.g., a USB port, wireless or wired network connection that is open to receiving the data, and the like.

Figure 2:
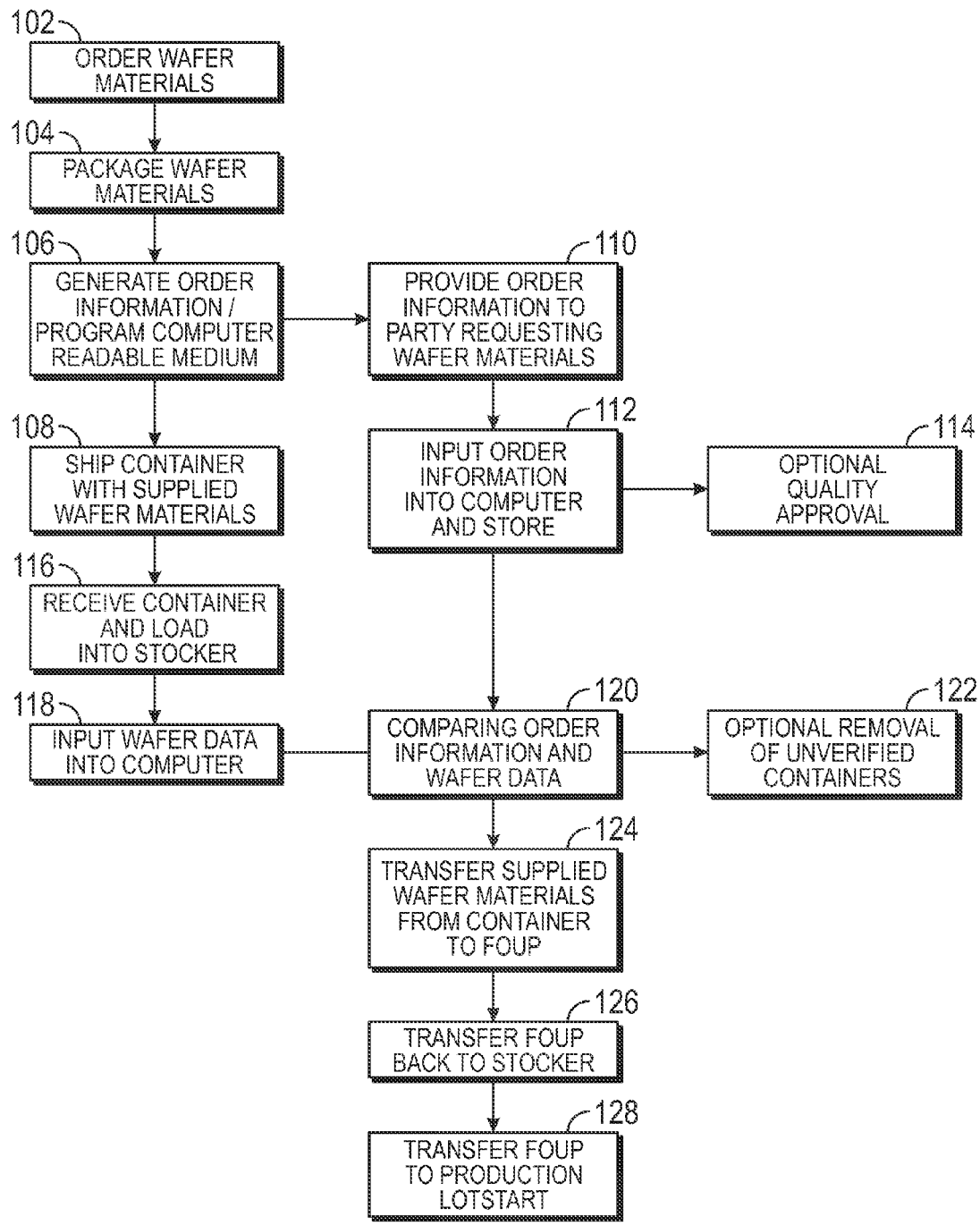
FIG. 2 is a process flow chart for waferstart process in accordance with an embodiment.

In accordance with the exemplary waferstart process 100 as shown in FIG. 2, wafers, such as semiconductor wafers, are ordered from a wafer supplier in step 102, which can be an internal supplier such as another fabrication location that is requested to shift the requested semiconductor materials to another fabrication location, or which can be a manufacturer of the requested semiconductor materials. Order information is generated for the requested wafers and, as described above, contains information regarding requested wafers that the wafer supplier includes with the shipment of the requested wafers. The order information may be contained in the CofA that is provided for quality approval of the shipment, and may be in electronic form as described above.

As shown in FIG. 2 at step 104, the wafer supplier packages the wafers in a container 15 that includes supplied wafers from the wafer supplier, and numerous containers 15 are generally packaged and shipped to satisfy the order of requested wafers. For example, the container 15 including the supplied wafers may be a front opening shipping box (FOSB), which is a specially-designed shipping container 15 for protecting wafers and enabling handling of the wafers while minimizing opportunities for contamination or damage. The containers 15 employed in accordance with the exemplary waferstart processes and systems described herein have a machine-readable medium 17 associated with the containers 15, i.e., the machine-readable medium 17 is disposed on or in the containers 15. Suitable machine-readable mediums 17 are not particularly limited, and examples of a suitable machine-readable medium 17 include a radio frequency identification tag, a barcode, a QR code, or the like. The machine-readable medium 17 is encoded with the wafer data that pertains to the supplied wafers in the container 15. In an embodiment and as shown at step 106 in FIG. 2, the wafer supplier generates the order information and encodes the machine-readable medium 17 with the wafer data. However, it is to be appreciated that in other embodiments, a party requesting the wafers may encode the machine-readable medium 17 and provide the machine-readable medium 17 to the wafer supplier for inclusion on or in the containers 15.

In an embodiment, the order information from the requested wafers and the wafer data from the supplied wafers include corresponding carrier identifications, which are effective to enable matching between the order information and the wafer data as described in further detail below. "Corresponding carrier identifications", as referred to herein, can be either matching carrier identifications or carrier identifications that are linkable to each other through another linking convention that does not require matching identical carrier identifications. The carrier identifications can be created by the wafer supplier or the party requesting the wafers. In an embodiment, the carrier identification is provided with a naming convention including a pre-set designation such as a fabrication location, a container type, a supplier identifier, a carrier type, and combinations of the pre-set designations. For example a first placeholder in the carrier identification can denote the carrier type for the container 15 (e.g., a category for the type of carrier such as a raw wafer FOSB); a second placeholder in the carrier identification can denote the fabrication location where the container 15 is to be shipped; a third placeholder can denote the particular container type (e.g., model number or design); a fourth placeholder can include the supplier identifier (e.g., supplier name), and remaining placeholders can be employed to designate product types associated with the supplier. The pre-set designations may be customized by the wafer supplier and/or the party requesting the wafers to enable coordination with the carrier identifications. The various placeholders can be populated with numbers/characters and the spaces in the placeholders may be varied to accommodate a range of options for each of the pre-set designations. The carrier identifications are unique for each container 15 to enable matching between the order information and the wafer data in the machine-readable medium 17 without risk of redundant record formation.

In an embodiment, at least one of the order information or the wafer data further includes additional information beyond the carrier identification, with the additional information such as a vendorlot identification, a part number, a vendor name, a delivery number, a shipping location associated with the carrier identification, or a combination of the additional information. Further, in an embodiment, the machine-readable medium 17 is encoded with the wafer data that pertains to the supplied wafers that are in the container 15. For example, the wafer data can include a wafer identification for individual supplied wafers in the container 15, locations of the individual wafers, and other pertinent information. In this manner, the specific contents of the container 15 can be registered within the computer 12 to pinpoint specific locations of the individual supplied wafers in the container 15.

In an embodiment and as shown in FIG. 2, after the order information is generated and the machine-readable medium 17 is encoded with the wafer data, the container 15 is shipped in step 108 and the order information is provided in step 110 to the party requesting the wafers. In one specific embodiment, a set of carrier identifications are first created by the party requesting the wafers, and the carrier identifications are provided to the wafer supplier for encoding into the machine-readable medium 17. The containers 15 are generally separately handled from the order information by the party requesting the wafers, with the order information employed to conduct quality approval of the shipment while the containers 15 are provided to a storage location. In an embodiment, the exemplary process continues, in step 112, with entering the order information from requested wafers into the computer 12 through the data input interface 14 of the computer 12. In this regard, the computer 12 is configured to receive the order information from the requested wafers through the data input interface 14 of the computer 12. In an embodiment, a vendorlot profile is created based on the order information, and the vendorlot profile may be automatically populated with the order information, which may be received in electronic form. The carrier identifications associated with the order information are also populated in the vendorlot profile. Once in the computer 12, the order information from the requested wafers can be stored in the storage medium 16 within the computer 12, such as in the vendorlot profile. Quality approval can optionally be conducted after creating the vendorlot profile in step 114.

The containers 15, being separated from the order information, are generally received at the storage location in step 116, where the containers 15 are stored until the supplied wafers contained therein are requested for use. In an embodiment, and as shown in FIG. 1, the exemplary waferstart system 10 further includes a stocker 18 that has a plurality of slots 20, with the slots 20 adapted to receive the containers 15 including the supplied wafers, such as the FOSB. The stocker 18 stores and maintains the containers 15 in the slots 20 to enable organization and tracking of the containers 15 as described in further detail below.

In accordance with an exemplary waferstart process 100, and as shown at step 118 in FIG. 2, the wafer data from the machine-readable medium 17 associated with the container 15 is entered into the computer 12, such as through reading the wafer data from the machine-readable medium 17 associated with the container 15 with a sensing device 22 and transferring the wafer data from the sensing device 22 to the computer 12. In this regard, the exemplary waferstart system 10 further includes the sensing device 22 that is adapted to read the wafer data from the machine-readable medium 17. Examples of suitable sensing devices 22 include, but are not limited to, barcode scanners, radio frequency identification readers, and the like, depending upon the type of corresponding machine-readable medium 17 associated with the container 15.

The computer 12 is adapted to receive the wafer data pertaining to the supplied wafers from the machine-readable medium 17 associated with the containers 15. In this regard, the sensing device 22 is in informational communication with the computer 12 for transferring the wafer data from the sensing device 22 to the computer 12. By "informational communication", it is meant that the sensing device 22 is capable of transferring the wafer data that is read with the sensing device 22 to the computer 12. For example, the sensing device 22 can be in wireless communication or electrical communication with the computer 12. Alternatively, the sensing device 22 can store the wafer data on a portable storage device (not shown), with the wafer data subsequently transferred to the computer 12 through the portable storage device. In an embodiment, the wafer data from the machine-readable medium 17 is stored in the storage medium 16 within the computer 12 after entering the wafer data.

In an embodiment, the exemplary waferstart process 100 includes loading the container 15 including the supplied wafers into the stocker 18 prior to reading the wafer data, and prior to transferring the supplied wafers from the container 15 to a FOUP 19 as described in further detail below. In this embodiment and as shown in FIG. 1, the exemplary waferstart system 10 includes a plurality of the sensing devices 22, with the sensing devices 22 disposed in respective slots 20 of the plurality of slots 20 for reading the wafer data from the machine-readable medium 17 that is associated with the containers 15 while the containers 15 are disposed in the slots 20 of the stocker 18. For example, the sensing devices 22 in the respective slots 20 may read the machine-readable medium 17 that is associated with the container 15 upon inserting the container 15 into the slot 20, effectively combining steps 116 and 118 as shown in FIG. 2. In this manner, specific locations of the containers 15 within the stocker 18 can be entered into the computer 12 along with wafer data from the machine-readable medium 17.

The exemplary process continues, as shown at step 120 in FIG. 2, with comparing the order information from the requested wafers and the wafer data from the supplied wafers within the computer 12 to create a verified data set in the computer 12 upon the computer 12 determining that the supplied wafers in the container 15 correspond to the requested wafers in the order information. In this regard, the computer 12 is configured to compare the order information from the requested wafers and the wafer data from the supplied wafers within the computer 12 to create the verified data set in the computer 12, and the storage medium 16 is adapted to store the verified data set in the storage medium 16. When the order information and the machine-readable medium 17 associated with the containers 15 include the corresponding carrier identifications, with the vendorlot profile created in the computer 12, the computer 12 compares the wafer data from the supplied wafers to the order information contained in the vendorlot profile for a particular shipment to create the verified data set, which may also be contained in the vendorlot profile. In an embodiment, the computer 12 compares the order information and the wafer data by matching the carrier identification of the container 15 and the carrier identification of the order information to create the verified data set in the computer 12. The verified data set provides a record that correlates the supplied wafers in the container 15 to the order information from requested wafers and provides a record of the supplied wafers in the container 15 so that the record of supplied wafers need not be created during a separate sorting process. The verified data sets enable specific container contents to be identified and tracked by the computer 12. The verified data set may also be created to include any additional information that is contained in the machine-readable medium 17, other than the carrier identification, including individual wafer identifications and any of the additional information described above. Further, the verified data set can be created to include the location of the supplied wafers in the stocker 18, and the location can be identified automatically when the sensing devices 22 are included in the respective slots 20 of the stocker 18.

Under circumstances where wafer data is entered into the computer 12 from a machine-readable medium 17 associated with the container 15 and the computer 12 fails to create a verified data set, the container 15 becomes an unverified container and the unverified container may be removed from the stocker 18, as shown in step 122 of FIG. 2. For example, if order information is unavailable for the unverified container, the unverified container may be removed from the stocker 18 to avoid inadvertent use of the supplied wafers in the unverified container. If possible, wafer data for the supplied wafers in the container 15 may be manually correlated to order information if an error exists in carrier identifications, for example, or the unverified container may be returned to the wafer supplier.

As shown at step 124 in FIG. 2, after creating the verified data set in the computer 12 and storing the verified data set in the storage medium 16, the supplied wafers are transferred from the container 15 to the FOUP 19. In an embodiment, the exemplary waferstart system 10 shown in FIG. 1 further includes a container transporter 24 that is adapted to move the containers 15 into and out of the plurality of slots 20 in the stocker 18. The container transporter 24 is controlled by the computer 12, with the computer 12 adapted to control movement of the containers 15 into and out of the plurality of slots 20 in the stocker 18 using the container transporter 24. In particular, the computer 12 is adapted to initiate transfer of the supplied wafers from the container 15 into and out of the plurality of slots 20 in stocker 18 to the FOUP 19 using the container transporter 24 based upon creation of and/or information contained in the verified data set that is stored in the storage medium 16. In an embodiment, the computer 12 automatically initiates transfer of the supplied wafers from the container 15 to the FOUP 19 after creation of the verified data set. In this regard, the supplied wafers can be made ready for use in integrated circuit fabrication when a lotstart is prepared to use the supplied wafers, and separate sorting of the supplied wafers in the container 15 is unnecessary because the verified data set already contains a record of the supplied wafers and the location of the supplied wafers in the FOUP 19. Once the supplied wafers are transferred from the container 15 to the FOUP 19, the FOUP 19 including the supplied wafers can be transferred back to the stocker 18, as shown at step 126 in FIG. 2, where the FOUP 19 may remain until the lotstart is prepared to receive the FOUP 19.

In an embodiment, the wafer data is entered into the computer 12, the order information and the wafer data are compared in the computer 12, and the supplied wafers are transferred from the container 15 to the front opening unified pod automatically after loading the container 15 into the stocker 18, and such automation may be triggered by the sensing device 22 reading the wafer data from the machine-readable medium 17. Such automation is made possible by providing the computer 12 that is adapted to compare the order information and wafer data to create the verified data set, and by providing the associated features of the waferstart process and system that enable the verified data set to be created.

In an embodiment, as shown in step 128 in FIG. 2, the waferstart process further includes transferring the FOUP 19 from the stocker 18 to a production lotstart 26 for commencing integrated circuit fabrication using the supplied wafers in response to a query of verified data sets received by the computer 12. As referred to herein, the "production lotstart" is a location where integrated circuit fabrication is conducted, and the production lotstart 26 may be in informational communication with the computer 12 to enable a query of verified data sets in the computer 12 by the production lotstart 26. The production lotstart 26 submits the query of verified data sets to the computer 12 and, upon the computer 12 determining that a FOUP 19 is present in the stocker 18 including the supplied wafers sought by the production lotstart 26, the computer 12 initiates transfer of the FOUP 19 from the stocker 18 to the production lotstart 26 using, for example, the container transporter 24. Presence of the FOUP 19 in the stocker 18 can be determined by locating the FOUP 19 within the stocker 18 with the computer 12 using the location of the supplied wafers in the stocker 18 in response to the query of verified data sets received by the computer 12. The FOUP 19 is then transferred from the stocker 18 to the production lotstart 26 for commencing integrated circuit fabrication using the supplied wafers in response to the query of verified data sets received by the computer 12 after the computer 12 locates the front opening unified pod within the stocker 18.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. A waferstart system for integrated circuit fabrication, said waferstart system comprising:
    a computer including a data input interface and a storage medium, the computer configured to receive order information from requested wafers through the data input interface of the computer and to receive wafer data pertaining to supplied wafers;
    a stocker having a plurality of slots adapted to receive a container including supplied wafers with the container having a machine-readable medium associated therewith and encoded with the wafer data pertaining to the supplied wafers in the container, wherein numerous containers are provided in the shipment of requested wafers, wherein the order information comprises information regarding the entire shipment, and wherein the order information is included with the shipment of the wafers,
    a sensing device adapted to read the wafer data from the machine-readable medium associated with the container, the sensing device in informational communication with the computer for transferring the wafer data from the sensing device to the computer; and
    a container transporter adapted to move the container into and out of the plurality of slots in the stocker;
    wherein the computer is configured to compare the order information from the requested wafers and the wafer data from the supplied wafers within the computer to create a verified data set in the computer, wherein the storage medium is adapted to store the verified data set therein, and wherein the computer is adapted to initiate transfer of the supplied wafers from the container into and out of the stocker to a front opening unified pod using the container transporter based upon creation of and/or information contained in the verified data set.

2. The waferstart system of claim 1, further comprising a plurality of the sensing devices with the sensing devices disposed in respective slots of the plurality of slots for reading the wafer data while the container is disposed in the slots of the stocker.

3. A waferstart process for integrated circuit fabrication, said wafers tart process comprising:
    entering order information from requested wafers into a computer through a data input interface of the computer, wherein the computer includes the data input interface and a non-transitory storage medium, wherein the order information comprises information regarding an entire shipment of requested wafers with numerous containers provided in the shipment, and wherein the order information is included with the shipment of the wafers;
    providing a container including supplied wafers and having a machine-readable medium associated therewith, wherein the machine-readable medium is encoded with wafer data pertaining to the supplied wafers in the container;
    entering the wafer data from the machine-readable medium associated with the container into the computer using a sensing device adapted to read the wafer data from the machine-readable medium associated with the container, wherein the sensing device is in informational communication with the computer for transferring the wafer data from the sensing device to the computer;
    comparing the order information from the requested wafers and the wafer data from the supplied wafers within the computer to create a verified data set in the computer upon the computer determining that the supplied wafers in the container correspond to the requested wafers in the order information;
    storing the verified data set in the non-transitory storage medium within the computer; and
    transferring the supplied wafers from the container to a front opening unified pod after creating the verified data set.

4. The waferstart process of claim 3, wherein providing the container having the machine-readable medium associated therewith comprises providing the machine-readable medium encoded with the wafer data including a carrier identification for the container and a wafer identification for individual supplied wafers in the container.

5. The waferstart process of claim 4, wherein the order information from the requested wafers and the wafer data from the supplied wafers include corresponding carrier identifications, and wherein comparing the order information and the wafer data comprises matching the carrier identification of the container and the carrier identification of the order information to create the verified data set in the computer.

6. The waferstart process of claim 5, wherein at least one of the order information or the wafer data further includes additional information chosen from a vendorlot identification, a part number, a vendor name, a delivery number, a shipping location associated with the carrier identification, or a combination thereof.

7. The waferstart process of claim 4, further comprising loading the container including the supplied wafers into a stocker prior to entering the wafer data, wherein the verified data set is created to include a location of the supplied wafers in the stocker.

8. The waferstart process of claim 7, further comprising locating the front opening unified pod within the stocker with the computer using the location of the supplied wafers in the stocker in response to a query of verified data sets received by the computer.

9. The waferstart process of claim 8, further comprising transferring the front opening unified pod from the stocker to a production lotstart for commencing integrated circuit fabrication using the supplied wafers in response to the query of verified data sets received by the computer after the computer locates the front opening unified pod within the stocker.

10. The waferstart process of claim 3, further comprising storing the order information from the requested wafers and the wafer data from the machine-readable medium in the storage medium within the computer after entering the order information and the wafer data, respectively.

11. The waferstart process of claim 3, further comprising loading the container including the supplied wafers into a stocker prior to transferring the supplied wafers from the container to the front opening unified pod.

12. The waferstart process of claim 11, wherein the container is loaded into the stocker prior to entering the wafer data into the computer, and wherein the wafer data is entered from the machine-readable medium while the container is disposed in the stocker.

13. The waferstart process of claim 12, further comprising removing an unverified container from the stocker upon failure to create the verified data set in the computer for the unverified container.

14. The waferstart process of claim 12, wherein entering the wafer data, comparing the order information and the wafer data, and transferring the supplied wafers from the container to the front opening unified pod are conducted automatically after loading the container into the stocker.

15. The waferstart process of claim 11, further comprising transferring the front opening unified pod including the supplied wafers back to the stocker after transferring the supplied wafers from the container to the front opening unified pod.

16. The waferstart process of claim 15, further comprising transferring the front opening unified pod from the stocker to a production lotstart for commencing integrated circuit fabrication using the supplied wafers in response to a query of verified data sets received by the computer.

17. The waferstart process of claim 3, wherein the machine-readable medium comprises a radio frequency identification tag, wherein the sensing device comprises a radio frequency identification reader, and wherein entering the wafer data comprises reading the radio frequency identification tag with the sensing device comprising the radio frequency identification reader.

18. The waferstart process of claim 3, further comprising generating the order information from the requested wafers and encoding the machine-readable medium with the wafer data pertaining to the supplied wafers in the container, and wherein a wafer supplier generates the order information and encodes the machine-readable medium.

19. A waferstart process for integrated circuit fabrication, said waferstart process comprising:
    entering order information from requested wafers into a computer through a data input interface of the computer, wherein the order information comprises numerous containers are provided in the shipment of requested wafers, wherein the order information comprises information regarding the entire shipment, and wherein the order information is included with the shipment of the wafers, and wherein the computer includes a data input interface and a non-transitory storage medium;
    providing a container including supplied wafers and having a machine-readable medium associated therewith, wherein the machine-readable medium is encoded with wafer data pertaining to the supplied wafers in the container including a carrier identification for the container and a wafer identification for individual supplied wafers in the container;
    loading the container into a stocker;
    reading the wafer data from the machine-readable medium associated with the container with a sensing device while the container is disposed in the stocker, wherein the sensing device is adapted to read the wafer data from the machine-readable medium associated with the container, wherein the sensing device is in informational communication with the computer;
    transferring the wafer data from the sensing device to the computer;
    matching the carrier identification of the container and the carrier identification of the order information within the computer to create a verified data set in the computer, wherein the verified data set is created to include a location of the supplied wafers in the stocker;
    storing the verified data set in the non-transitory storage medium within the computer;
    transferring the supplied wafers from the container to a front opening unified pod after creating the verified data set;
    transferring the front opening unified pod including the supplied wafers back to the stocker after transferring the supplied wafers from the container to the front opening unified pod;
    locating the front opening unified pod within the stocker with the computer using the location of the supplied wafers in the stocker in response to a query of verified data sets received by the computer; and
    transferring the front opening unified pod from the stocker to a production lotstart for commencing integrated circuit fabrication using the supplied wafers in response to the query of verified data sets received by the computer after the computer locates the front opening unified pod within the stocker.

* * * * *